United States Patent [19]
Satoh

[11] Patent Number: 5,744,810
[45] Date of Patent: Apr. 28, 1998

[54] METHOD AND SYSTEM FOR EXPOSING PATTERN ON OBJECT BY CHARGED PARTICLE BEAM

[75] Inventor: Takamasa Satoh, Kawasaki, Japan

[73] Assignee: Fujitsu Ltd., Kawasaki, Japan

[21] Appl. No.: 709,815

[22] Filed: Sep. 10, 1996

[30] Foreign Application Priority Data

Mar. 19, 1996 [JP] Japan ................................ 8-063511

[51] Int. Cl.$^6$ ...................................... H01J 37/302
[52] U.S. Cl. .................... 250/492.23; 250/492.22
[58] Field of Search ................. 250/492.23, 492.22, 250/492.2

[56] References Cited

U.S. PATENT DOCUMENTS

| | | | |
|---|---|---|---|
| 4,942,342 | 7/1990 | Tsukakoshi | 250/492.2 |
| 5,148,033 | 9/1992 | Yamada et al. | 250/492.2 |
| 5,368,613 | 11/1994 | Yasutake et al. | 250/492.2 |

*Primary Examiner*—Jack I. Berman
*Attorney, Agent, or Firm*—Staas & Halsey

[57] ABSTRACT

A cyclic wave v1 of a cycle T/m, such as a sine wave or a pulse wave, is generated, where T is one exposure period and m is a natural number. For each i=1 to 3, cyclic waves v2 to v4 are generated by delaying the cyclic wave v1 by i(T/4m), amplified and supplied to the electrodes of electrostatic deflectors 40, 50 and 60 in such a way that the electric fields formed at the deflectors 40 and 50 have opposite phases each other. For each electrostatic deflector, the phase difference between the voltage waveforms supplied to adjacent electrodes is T/4m and m may be set freely.

11 Claims, 12 Drawing Sheets

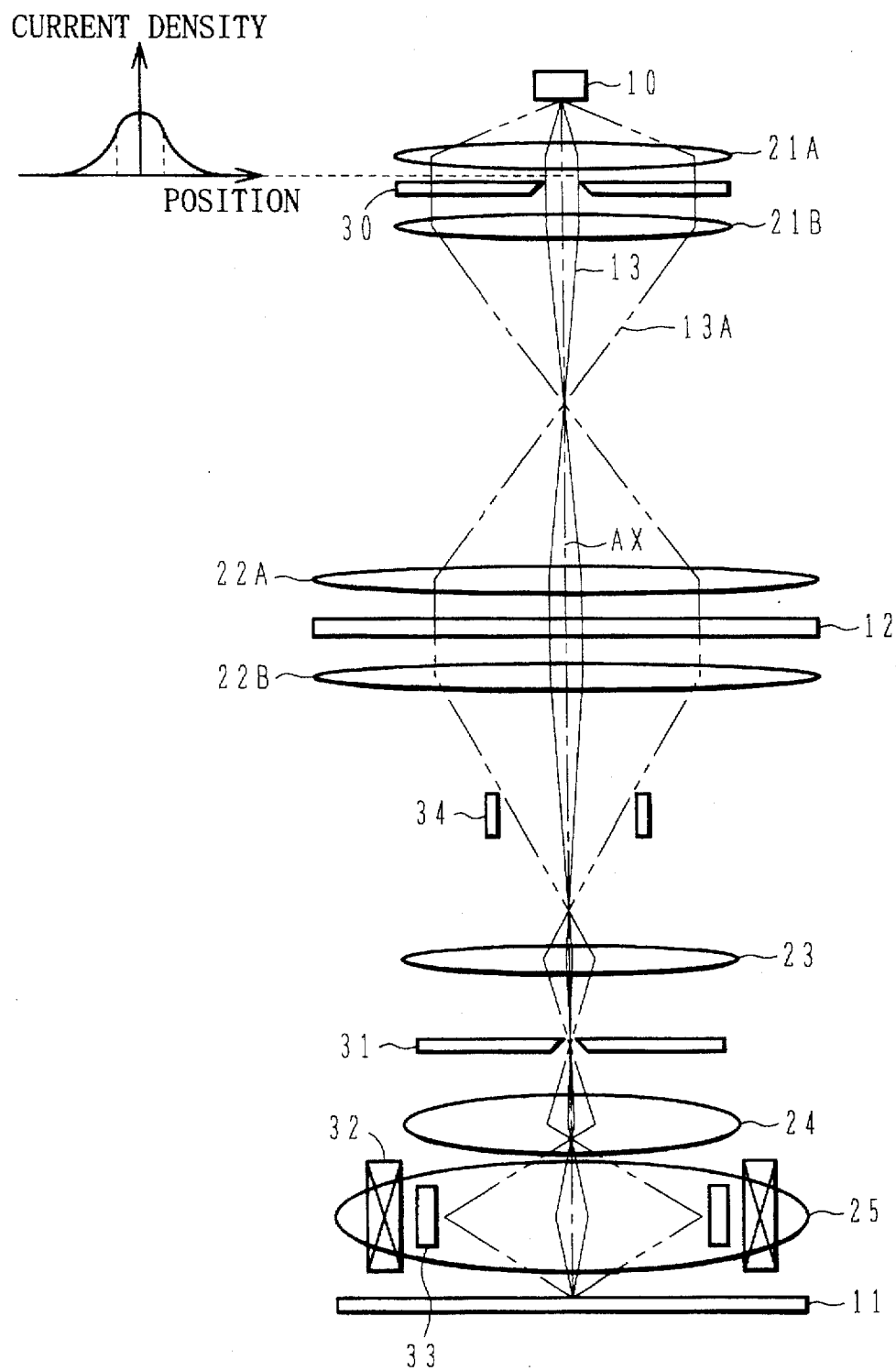

METHOD AND SYSTEM FOR EXPOSING PATTERN ON OBJECT BY CHARGED PARTICLE BEAM

BACKGROUND OF THE INVENTION

1. Field of the Invention

The present invention relates to a method and a system for exposing a pattern on an object, such as a semiconductor wafer or a mask coated with resist, by a charged particle beam.

2. Description of the Related Art

FIG. 11 shows the schematic structure of a system for charged particle beam exposure in the prior art.

A charged particle beam, an electron beam for instance, irradiated from a charged particle gun 10 is shaped with its transverse cross section by the aperture pattern at a selected block on the stencil mask 12, and focused and irradiated on a semiconductor wafer 11, with one shot of the charged particle beam, a minute pattern is exposed on a resist film on the semiconductor wafer 11.

In FIG. 11, AX indicates the optical axis, reference number 13 indicates a polygonal approximation of the locus of the charged particle beam and the reference number 13A shows the locus 13 enlarged in the direction running at a right angle to the optical axis AX to clearly illustrate the refraction of the charged particle beam imparted by electromagnetic lenses. 21A, 21B, 22A, 22B and 23 to 25 indicate electromagnetic lenses and reference numbers 30 and 31 indicate aperture stops. The electromagnetic lens 23 causes a crossover in the charged particle beam at the aperture of the aperture stop 31, the electromagnetic lenses 23 and 24 are for demagnification projection and the electromagnetic lens 25 is an objective lens. The aperture stop 31 restricts the angle of the incident charged particle beam at crossover and its aperture is circular. Reference numbers 32 and 33 indicate a main deflector and a sub deflector respectively for scanning the charged particle beam on the semiconductor wafer 11, and reference number 34 is a blanking deflector for blanking the charged particle beam at the aperture stop 31 during a period of time when exposure is not in progress. In FIG. 11, for the sake of simplification, the deflector for selecting a block on the stencil mask 12, the deflector for returning the charged particle beam, that has passed through a block, onto the optical axis and the like, are omitted.

The blocks on the stencil mask 12 are rectangular and corresponding to this, the aperture of the aperture stop 30 is rectangular. Referring to FIG. 11, the current density through transverse cross section of the charged particle beam emitted from the charged particle gun 10, is distributed in an approximate Gaussian distribution, and with the hem of the Gaussian distribution cut by the aperture stop 30, the current density is made more constant compared to that before the cut.

However, since the even distribution of the current density is not sufficient when, for instance, the block for one shot is 5 µm×5 µm and the width of the pattern to be formed within the block is 0.1 µm on the semiconductor wafer 11, the error of the pattern width between the center and the peripheral portion of the block is approximately 0.03 µm, which limits how minute the pattern can be. In order to reduce this error, if the length of the aperture of the aperture stop 30 and the length of one side of the block on the stencil mask 12 are set at, for instance, 1/1.4, the number of shots will be approximately doubled, greatly reducing the throughput of exposure. Moreover, since the energy intercepted at the aperture stop 30 increases, the temperature of the aperture stop 30 goes up and a portion of it evaporates, reducing its service life. These problems also arise when a rectangular mask or a blanking aperture array mask is used instead of a stencil mask.

SUMMARY OF THE INVENTION

Accordingly, an object of the present invention is to provide a method and a system for exposing a pattern on an object by a charged particle beam that can draw more fine patterns without reducing the throughput of exposure.

According to the 1st aspect of the present invention, there is provided a system for charged particle beam exposure, comprising: a charged particle gun for emitting the charged particle beam; a mask having an aperture for shaping a cross section of the charged particle beam; the system further comprising: a first electrostatic deflector having n number of deflecting electrodes around an optical axis between the charged particle gun and the mask for deflecting the charged particle beam; a second electrostatic deflector having n number of deflecting electrodes around the optical axis between the first electrostatic deflector and the mask for deflecting the charged particle beam; a cyclic wave generating circuit for outputting a cyclic wave with a cycle of T/m, where T is one exposure period and m is a natural number; a delay circuit for delaying the cyclic wave by a time of iT/(mn) for each i=1 to (n−1); and an amplifier circuit for amplifying the cyclic wave from the cyclic wave generating circuit and (n−1) delayed cyclic waves from the delay circuit to get 1st to nth drive voltages, the 1st to nth drive voltages being supplied to the n number of deflecting electrodes of the first electrostatic deflector respectively and to the n number of deflecting electrodes of the second electrostatic deflector respectively in such a way that an electric field formed at the first electrostatic deflector and an electric field formed at the second electrostatic deflector have opposite phases from each other.

With the 1st aspect, since the average current density distribution during one period of exposure of the charged particle beam can be made approximately constant, for example, within the area where the charged particle beam is to be irradiated on the mask, an advantage is achieved in that more minute patterns can be drawn without reducing the throughput of exposure. In addition, since a cyclic wave that is delayed at a delay circuit is used, only one cyclic wave generating circuit is required and, therefore, an advantage is achieved in that the structure and the timing adjustment of the cyclic waves can be simplified.

In the 1st mode of the 1st aspect of the present invention, the delay circuit includes (n−1) delay elements connected in series, each of (n−1) delay elements have a delay time T/(mn), the cyclic wave from the cyclic wave generating circuit is supplied to a first stage of the (n−1) delay elements, and a signal having passed through each of the (n−1) delay elements is output.

With the 1st mode, since the delay circuits are connected in series, delay circuits with the same delay time may be used and an advantage is achieved in that the structure is simplified.

In the 2nd mode of the 1st aspect of the present invention, the cyclic wave from the cyclic wave generating circuit is a sine wave, and the amplifier circuit is connected to the first and second electrostatic deflectors in such a way that a phase difference of waveforms supplied to adjacent deflecting electrodes is T/(mn).

With the 2nd mode, since the scanning performed by the electrostatic deflectors is continuous, an advantage is achieved in that the constant described above can be enhanced.

In the 3rd mode of the 1st aspect of the present invention, the cyclic wave from the cyclic wave generating circuit is a pulse wave.

With the 3rd mode, since the delay circuits may be constituted with digital circuits, the structure of the delay circuits can be simplified even when the number of settings for delay time is large, and the accuracy of delay time is improved.

In the 4th mode of the 1st aspect of the present invention, the cyclic wave generated circuit have means for setting a pulse width of the pulse wave.

With the 4th mode, an advantage is achieved in that the constant described above can be adjusted by adjusting the pulse width.

In the 5th mode of the 1st aspect of the present invention, the cyclic wave generated circuit have means for setting the m.

With the 5th mode, in case of adjusting delay time T/(mn) according to one exposure period T, it is possible to bring delay time closer to desirable one by setting the parameter m suitably.

In the 6th mode of the 1st aspect of the present invention, it further comprises a first aperture stop having a first aperture for allowing a portion of the charged particle beam to pass through; a second aperture stop having a second aperture for allowing a portion of the charged particle beam having passed through the mask; and an electron lens system for making the charged particle beam cross over at the second aperture, and for getting demagnificated projection of a shaped charged particle beam on the object; wherein the first electrostatic deflector is for deflecting the charged particle beam to make a time averaged current density of the charged particle beam approximate constant, either within an area where the charged particle beam is to be irradiated on the mask or at the first aperture; and the second electrostatic deflector is for deflecting the charged particle beam to ensure that the charged particle beam passes through the second aperture.

In the 7th mode of the 1st aspect of the present invention, it further comprises a third electrostatic deflector, having n number of deflecting electrodes around the optical axis between the charged particle gun and the second aperture stop, for deflecting the charged particle beam to correct offset of the charged particle beam at the second aperture; wherein the amplifier circuit amplifies the cyclic wave from the cyclic wave generating circuit and (n−1) delayed cyclic waves from the delay circuit to get another 1st to nth drive voltages, the another 1st to nth drive voltages being supplied to the n number of deflecting electrodes of the third electrostatic deflector respectively in such a way that the electric field formed at the first electrostatic deflector and an electric field formed at the third electrostatic deflector have phases identical to, or opposite from each other.

In case that the outputs from the amplifier circuit are provided to the first and second electrostatic deflectors commonly, it is possible in design stage that the charged particle beam passes through the aperture of a second aperture stop.

However, in practice, the charged particle beam offsets from the center of the second aperture.

Since the degree of the offset is in proportion to the intensity of the electric field generated at the first electrostatic deflector and the offset is very small in general, the amplifier circuit gain for the third electrostatic deflector may be sufficiently smaller than that for the first and second electrostatic deflectors. In addition, the smaller the gain, the higher the output accuracy of an amplifier circuit.

Therefor, an advantage with the 7th mode is achieved in that the accuracy with which correction is performed for the offset by the third electrostatic deflector increases. It is only necessary to change the connection between the amplifier circuit and the third electrostatic deflector when the correction quantity is in a negative phase.

According to the 2nd aspect of the present invention, there is provided a method of exposing a pattern on an object using a system, the system comprising: a charged particle gun for emitting the charged particle beam; a mask having an aperture for shaping a cross section of the charged particle beam; a first electrostatic deflector having n number of deflecting electrodes around an optical axis between the charged particle gun and the mask for deflecting the charged particle beam; and a second electrostatic deflector having n number of deflecting electrodes around the optical axis between the first electrostatic deflector and the mask for deflecting the charged particle beam; the method comprising the step of: generating a first cyclic wave with a cycle of T/m, where T is one exposure period and m is a natural number; delaying the cyclic wave by a time of iT/(mn) for each i=1 to (n−1); and amplifying the cyclic wave and (n−1) delayed cyclic waves to get 1st to nth drive voltages; and supplying the 1st to nth drive voltages to the n number of deflecting electrodes of the first electrostatic deflector respectively and to the n number of deflecting electrodes of the second electrostatic deflector respectively in such a way that an electric field formed at the first electrostatic deflector and an electric field formed at the second electrostatic deflector have opposite phases from each other.

In the 1st mode of the 2nd aspect of the present invention, the cyclic wave is a sine wave, and a phase difference of waveforms supplied to adjacent deflecting electrodes of the first and second electrostatic deflectors is T/(mn).

In the 2nd mode of the 2nd aspect of the present invention, the cyclic wave is a pulse wave, and the method further comprising the step of adjusting the approximate constant of the average current density distribution by adjusting a pulse width of the pulse wave.

BRIEF DESCRIPTION OF THE DRAWINGS

FIG. 11 is a schematic illustration of a system for charged particle beam exposure in the prior part.

DESCRIPTION OF THE PREFERRED EMBODIMENTS

Figure 1:
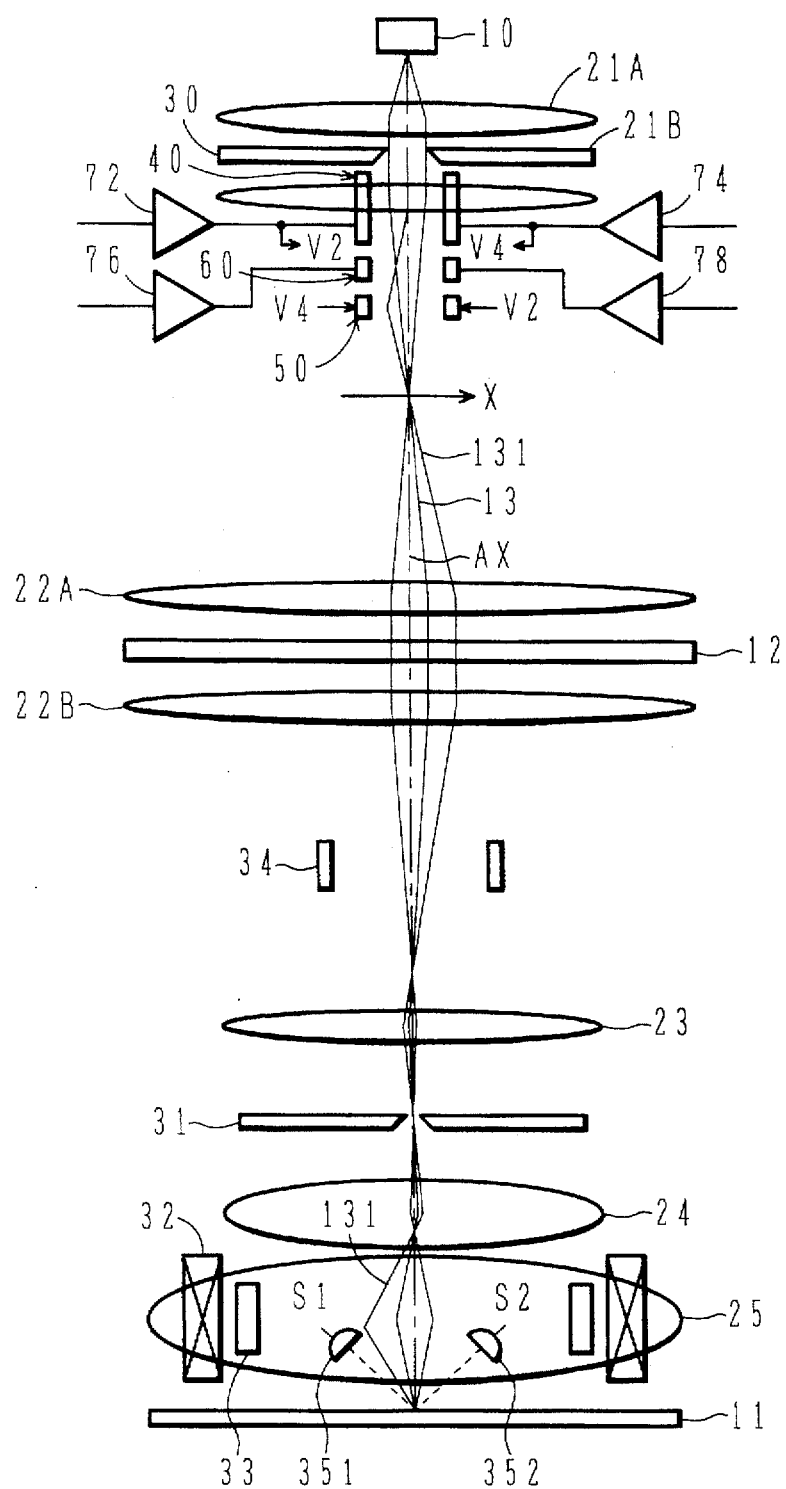
FIG. 1 is a schematic illustration of a system for charged particle beam exposure in a first embodiment according to the present invention.

Referring now to the drawings, preferred embodiments of the present invention are described below.

First Embodiment

FIG. 1 shows the main portion of a system for charged particle beam exposure in a first embodiment according to the present invention. The same reference numbers are assigned to component elements that are identical to those in FIG. 11 and their explanation is omitted.

Figure 2:
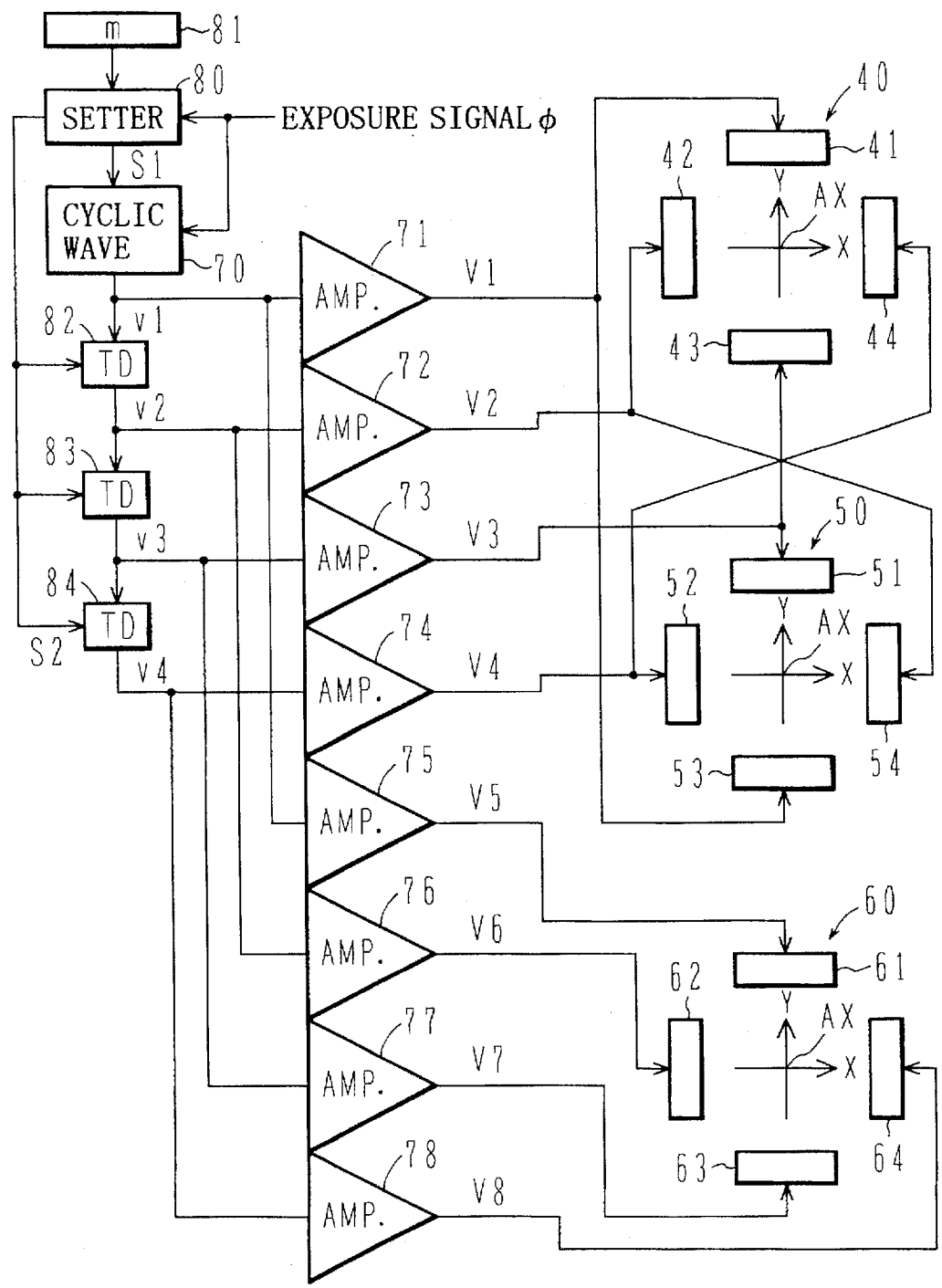
FIG. 2 is a schematic diagram of a drive circuit for the deflector shown in FIG. 1 for making the beam current density constant.

Electrostatic deflectors 40 and 50 are provided between an aperture stop 30 and a stencil mask 12 toward the aperture stop 30 along the optical axis AX. An electrostatic deflector 60 is provided between the electrostatic deflector 40 and the electrostatic deflector 50. Referring to FIG. 2, the electrostatic deflectors 40, 50 and 60 all have a 4-electrode structure with the four electrodes provided surrounding the optical axis AX, comprising a pair of electrode plates that face opposite each other in the direction of the X-axis running vertical to the optical axis AX and a pair of electrode plates that face opposite each other in the direction of the Y-axis running vertical to the optical axis AX and the X-axis.

During one exposure period T (FIG. 4) over which an exposure signal φ is set at high, exposure of one block pattern is performed. A cyclic wave v, such as a sine wave, is generated from a cyclic wave generating circuit 70 in synchronization with the exposure signal φ. The cycle Tp of this cyclic wave v can be set freely and a setting circuit 80 sets T/m for the cycle Tp to the wave generating circuit 70 with a setting signal S1. T/m is calculated using a value m that has been set in a register 81 and the pulse width T of the exposure signal φ. One exposure period T is determined in the setting circuit 80 by measuring the pulse width T of the exposure signal φ with a clock and is held in an internal register. The setting circuit 80 sets T/(4m) for the delay time of all the delay circuits 82 to 84 with a setting signal S2. In this first embodiment, the electrostatic deflectors 40, 50 and 60 each have 4 poles and, generally speaking, when a deflector has n poles, the delay time should be set at T/(nm).

Figure 3:
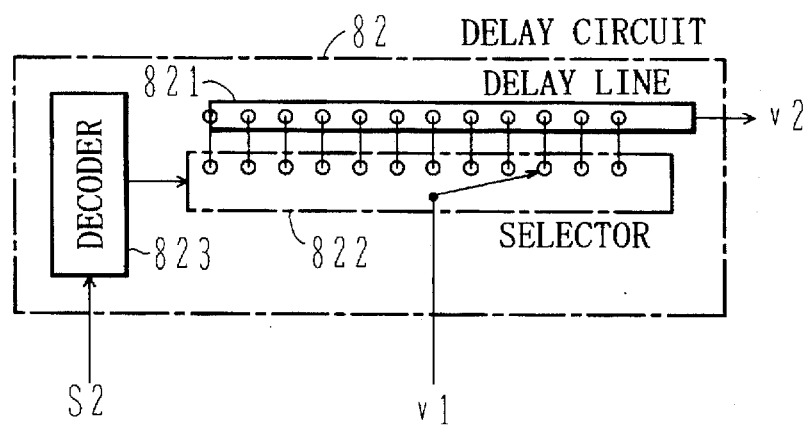
FIG. 3 shows a structural example of the delay circuit shown in FIG. 2.

The delay circuits 82 to 84 have identical structures, and a structural example of the delay circuit 82 is shown in FIG. 3.

The delay circuit 82 is provided with a delay line 821, a selector 822 for selecting one of the equipartitioning points of the delay line 821 for an input point and a decoder 823 that controls the selection by decoding a setting signal S2. The cyclic wave v1 provided to the selector 822 passes through a portion of the delay line 821 to be delayed and is then output as a cyclic wave v2.

In FIG. 2, the cyclic wave v1 is amplified by amplifiers 71 and 75 on the one hand, and passes through the delay circuit 82 so that its phase is delayed by 90° to become the cyclic wave v2 on the other hand. The cyclic wave v2 is amplified by amplifiers 72 and 76 on the one hand, and passes through the delay circuit 83 so that its phase is delayed by 90° to become the cyclic wave v3 on the other hand. The cyclic wave v3 is amplified by amplifiers 73 and 77 on the one hand and passes through the delay circuit 84 so that its phase is delayed by 90° to become a cyclic wave v4 on the other hand. The cyclic wave v4 is amplified at amplifiers 74 and 78.

The output voltages of the amplifiers 71 to 78 are respectively expressed as V1 to V8. The amplitudes of the voltages V1 to V4 are equal to one another and have the waveform shown in FIG. 4 when m=1 and the cyclic wave v1 is a sine wave. The amplitudes of the voltages V5 to V8 are also equal to one another and the voltages V5 to V8 have values that are in proportion to the voltages V1 to V4 respectively. The voltages V1 to V4 are provided to deflecting electrodes 41 to 44 respectively of the electrostatic deflector 40 on one hand, and are provided to deflecting electrodes 53, 54, 51 and 52 of the electrostatic deflector 50 on the other hand. In other words, voltages at reverse phase from those provided to the electrostatic deflector 40 are provided to the electrostatic deflector 50. The voltages V5 to V8 are provided to deflecting electrodes 61 to 64 respectively of the electrostatic deflector 60.

The locus 13 in FIG. 1 is under the same condition (no deflection) as in FIG. 11. The locus 131 is a polygonal approximation of the locus obtained when a charged particle beam which has passed through the optical axis AX and has entered the electrostatic deflector 40 is deflected by the electrostatic deflectors 40 and 50. Since the direction of the electric field formed by the electrostatic deflector 40 and the direction of the electric field formed by the electrostatic deflector 50 are reversed from each other, the charged particle beam which has been swung by the electrostatic deflector 40 is then bent in the direction in which it is swung back by the electrostatic deflector 50. In ideal case, the cross overs under no deflection are the same as under deflection as shown in FIG. 1.

The electrostatic deflector 50 is at a distance from the electrostatic deflector 40 in order to bend the charged particle beam in the direction in which it is swung back after waiting for the deviation of the charged beam deflected by the electrostatic deflector 40 from the optical axis AX to reach a specific quantity.

Figure 5:
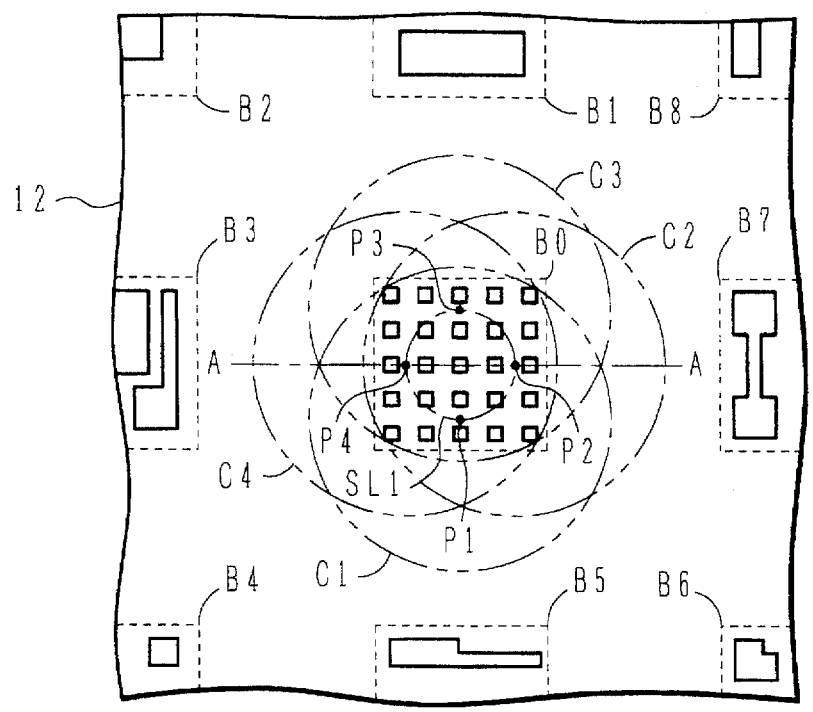
FIG. 5(A) is a plan view showing the scanning of the charged particle beam on a stencil mask and FIG. 5(B) shows the beam current density distribution along line A—A in FIG. 5(A)
Figure 5:
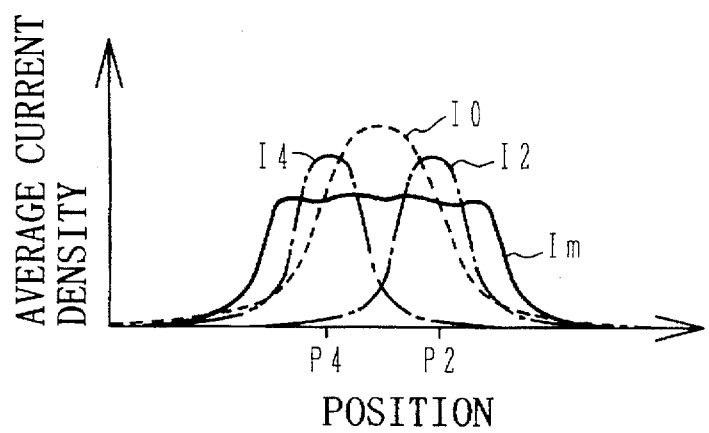

FIG. 5(A) shows the scanning of charged particle beam on a stencil mask 12.

B0 to B8 are all blocks of aperture patterns and the patterns of one block is projected in demagnified size on a semiconductor wafer 10 with one shot. This one block is selected, as will be known to those skilled in the art, with a charged particle beam swung by a deflector (not shown) provided between the electrostatic deflector 50 and the electromagnetic lens 22A in FIG. 1, and is swung back onto the optical AX by a deflector (not shown) provided between the electromagnetic lens 22B and the electromagnetic lens 23. A case in which the charged particles are electrons and the block B0 is selected is considered below.

Figure 4:
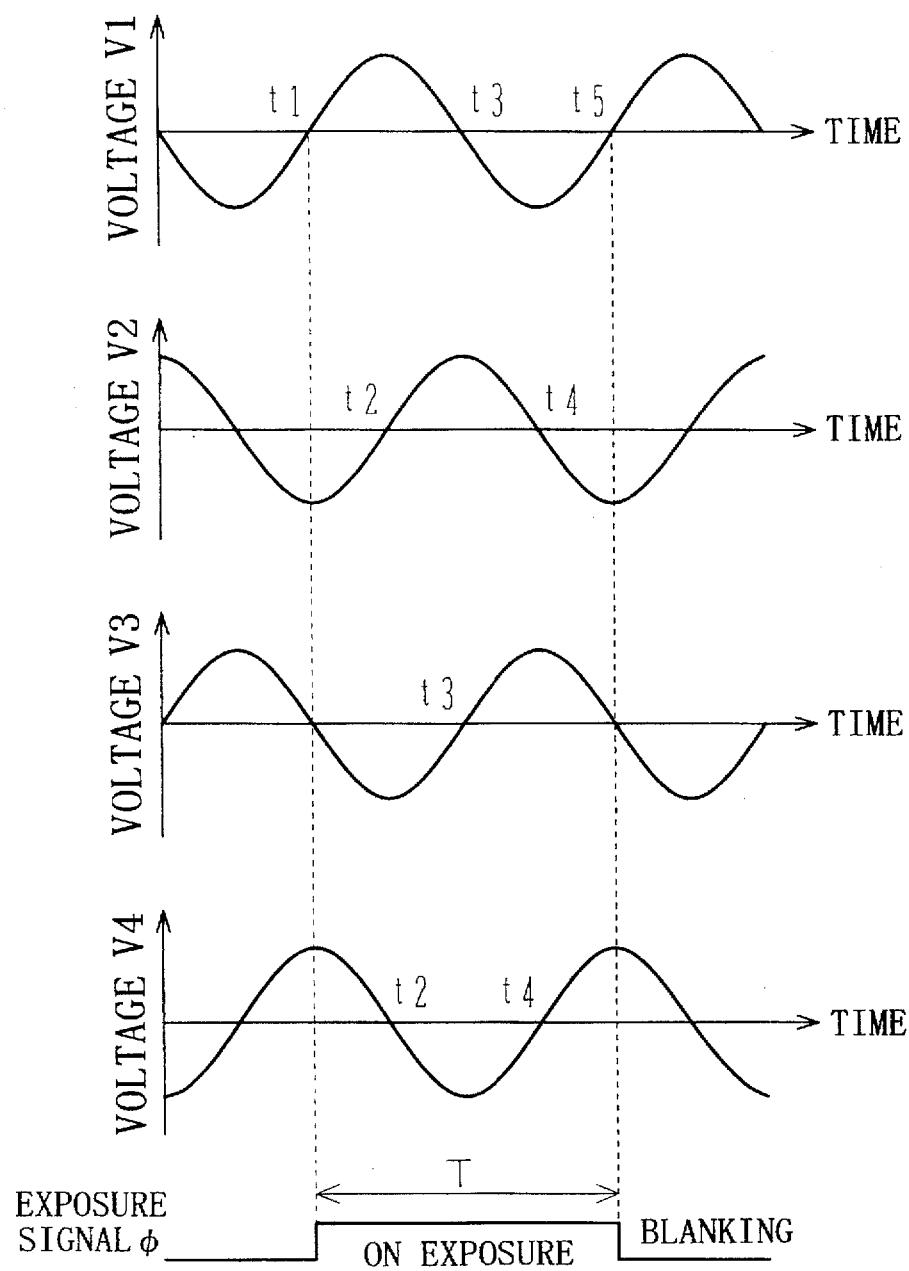
FIG. 4 shows waveform diagrams of the voltages applied to the deflectors for making the beam current density constant.

In FIG. 5(A), the center of the charged particle beam scans over the circular beam-scanning line SL1, which is indicated with the alternate long and short line, at a constant speed and the center is at positions P2 to P4, P1 and P2 at time points t1 to t5 respectively in FIG. 4. C1 to C4 are the shapes of the transverse cross sections of the charged particle beam when the center is at positions P1 to P4 respectively. The current density distributions of C4 and C2 along line A—A are approximately Gaussian distribution as indicated with I4 and I2 in FIG. 5(B). The time averaged current density for one cycle between time point t1 and t5 is as indicated with the solid line Im in FIG. 5(B) and is made approximately constant. I0, indicated with a dotted line, represents a case in which the emission intensity of the charged particle gun 10 is increased and the aperture of the aperture stop 30 is widened without using the electrostatic deflectors 40, 50 and 60. It is obvious that the even distribution of the beam current density according to the present invention is superior by comparing the current density distribution Im against the current density distribution I0.

In FIG. 4, before the time point t1 and after the time point t5, the charged particle beam is swung by the blanking deflector 34 shown in FIG. 1 and is blocked by the aperture stop 31. During this period of time, the driving quantity of the main deflector 32 or the sub deflector 33 is changed in order to change the exposure position on the semiconductor wafer 10, or the selection of a block on the stencil mask 12 is changed. Although FIG. 4 shows a case in which m=1, m may also be an integer of 2 or more.

Because of small quantities of deflection imparted by the electrostatic deflectors 40 and 50, exposure can be achieved even at high speed with the exposure time of one shot at 50 nsec and the frequency of the sine wave at 100 MHz (1 cycle=10 nsec).

In FIG. 1, the electrostatic deflector 50 ensures that the beam center passes through the center of the aperture in the aperture stop 31 by bending the charged particle beam, which has been swung by the electrostatic deflector 40, in the direction in which it is swung back. The length of the electrostatic deflector 50 in the direction of the optical axis and its mounting position are determined during the design stage so that when the output voltages from the amplifiers 71 to 74 are commonly provided to the electrostatic deflectors 40 and 50 as shown in FIG. 2, the locus 131 passes through the center of the aperture in the aperture stop 31. However, in practice, the locus 131 is offset from the center of the aperture in the aperture stop 31. The degree of this misalignment is in proportion to the intensity of the electric field of the electrostatic deflector 40 and the actual quantity of misalignment is very slight. Gain adjustment is performed for the amplifiers 75 to 78 to reduce this misalignment to zero. This adjustment is implemented by maximizing the sum S of secondary electron detection quantities S1 and S2 detected by secondary electron detectors 351 and 352, shown in FIG. 1, before exposure.

The gains of the amplifiers 75 to 78 are sufficiently smaller than those of the amplifiers 71 to 74. Since the output accuracy of an amplifier improves as the gain is reduced, the accuracy of correction of the misalignment caused by the electrostatic deflector 60 improves. When the phase of the correction quantity is reversed from that in the case shown in FIG. 2, connections should be changed so that the voltages V5 to V8 are provided to deflecting electrodes 63 and 64 and deflecting electrodes 61 and 62 respectively.

The electrostatic deflector 60 is provided between the electrostatic deflector 40 and electrostatic deflector 50 so that the free area is efficiently utilized and the entire configuration of the electrostatic deflectors 40, 50 and 60, which are related to each other, can be made more compact.

In the above-described first embodiment, since the average current density distribution of the charged particle beam on a block can be made approximately constant without reducing the block size on the stencil mask 12, it is possible to draw more minute patterns without reducing the throughput of exposure. In addition, this constant can be maintained even when the length of one exposure period is changed depending upon the level of charged particle beam energy or the kind of resist since the charged particle beam is scanned in a exposure period T with a cyclic wave having a cycle of T/m and T/m can be set freely. Furthermore, since waveforms obtained by delaying the cyclic wave v1 at the delay circuits 82 to 84 are used, only one cyclic-wave generating circuit 70 is required and the structure, as well as the timing and adjustment of the cyclic waves can be simplified. Moreover, it is possible to improve the throughput of exposure by increasing the size of each block of the stencil mask 12.

First variation of the first embodiment

Figure 6A:
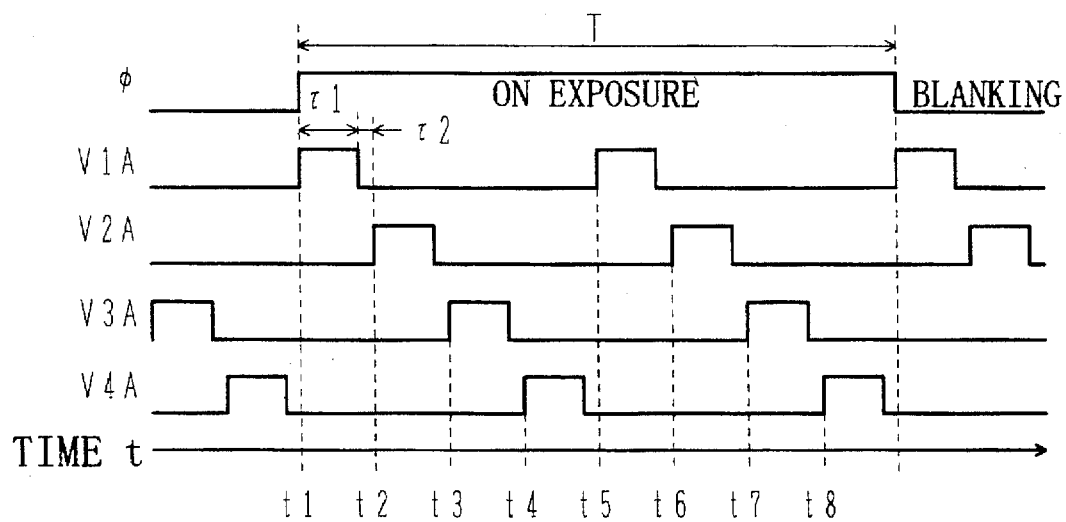
FIGS. 6(A) and 6(B) show a first variation of the first embodiment according to the present invention with FIG. 6(A) showing waveform diagrams of the voltages applied to the deflectors and FIG. 6(B) illustrating the beam scanning on a stencil mask by the deflectors.
Figure 6B:
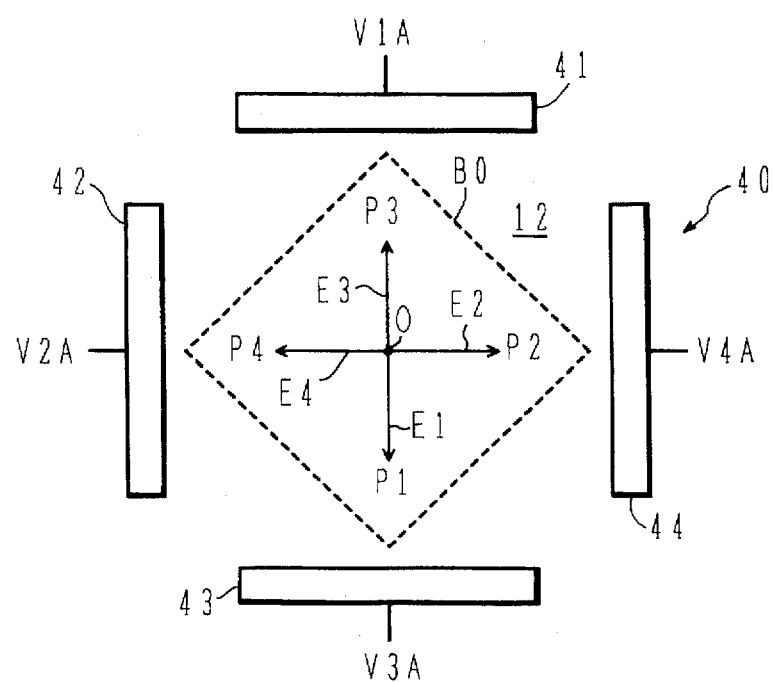

FIGS. 6(A) and 6(B) show a first variation of the first embodiment. A block B0 and an electrostatic deflector 40 in FIG. 6(B) are not presented at the same scale.

The cyclic wave generating circuit 70 shown in FIG. 2 outputs a square pulse wave, and the drive voltages V1A to V4A shown in FIG. 6(A) are supplied to the deflecting electrodes 41 to 44 respectively. In this case, the delay circuits 82 to 84 in FIG. 2 are each constituted with a digital circuit. When the number of settings for delay time is large, it is desirable to employ digital delay circuits rather than analog delay circuits since their structure is simpler and also their delay time accuracy is better.

In the cyclic wave generating circuit 70, the pulse period and the output amplitude may be set and adjusted freely.

Referring to FIG. 6(B), the electrostatic deflector 40 is arranged with rotation by 45° relative to the block B0 of the stencil mask 12. E1 to E4 indicate the electric field vectors at a center 0 of the electrostatic deflector 40 after the pulse has risen at time points t=t1 to t4 respectively. The center of the electron beam is at positions P3, P4, P1 and P2 after the pulse has risen at the time points t=t1 to t4 respectively. The center of the electron beam stays at each of these positions for the duration of a pulse period $\tau 1$, and during a period $\tau 2$ before the next pulse is supplied to an adjacent electrode it stays at the center 0. For instance, when $\tau 2/\tau 1=\frac{1}{5}$, the lengths of time over which the center of the electron beam stays at the positions P1 to P4 and 0 during one exposure period T will be equal one another.

Consequently, by adjusting the pulse period $\tau 1$ and the amplitudes of the drive voltages V1A to V4A (the gains of the amplifiers or the output amplitudes of the cyclic wave generating circuit 70), the approximate constant of the average current density distribution of charged particle beam on the block B0 can be adjusted.

In such scanning, since the charged particle beam moves from the center 0 in the direction of the radius, the phase difference between the waveforms of the voltages applied to adjacent electrodes of the electrostatic deflector 40 may be set freely.

The relationship between the electrostatic deflector 40 and the electrostatic deflectors 50 and 60 is similar to that in the first embodiment explained earlier.

Second variation of the first embodiment

Figure 7:
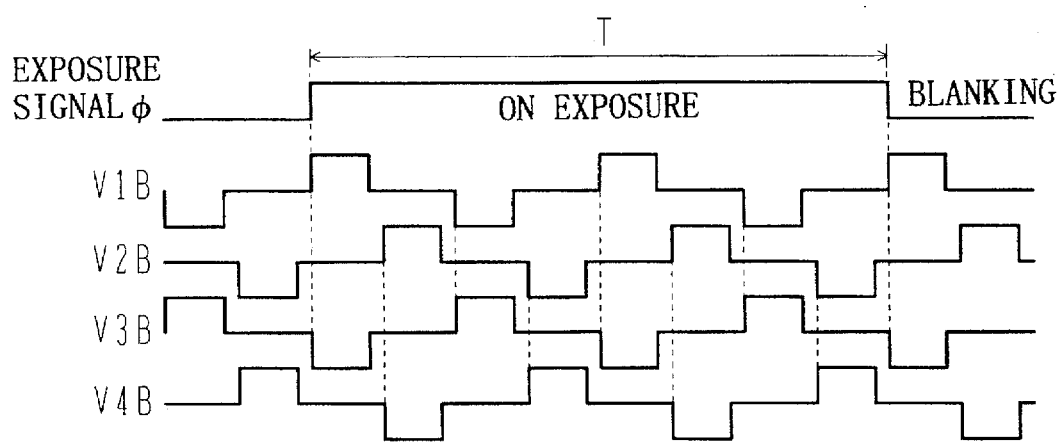
FIG. 7 shows waveform diagrams of the voltages applied to the deflectors in a second variation of the first embodiment according to the present invention.

FIG. 7 shows a waveform diagram of the voltages applied to the deflectors in a second variation of the first embodiment. Drive voltages V1B to V4B respectively correspond to the drive voltages V1A to V4A in FIG. 6 (A).

In each of the drive voltages V1B to V4B, a positive pulse and a negative pulse are present as a pair in one cycle and a pair of positive and negative pulses is supplied simultaneously between a pair of electrodes that face opposite each other. In this case, since the deflection quantity is double as much as that in the first variation explained above with potentials of the same amplitude, the amplitude of the drive voltage can be reduced to half that in the first variation, achieving an improvement in deflection accuracy and an improvement in the maximum possible scanning speed.

Other features are identical to those of the first variation.

Third variation of the first embodiment

Figure 8A:
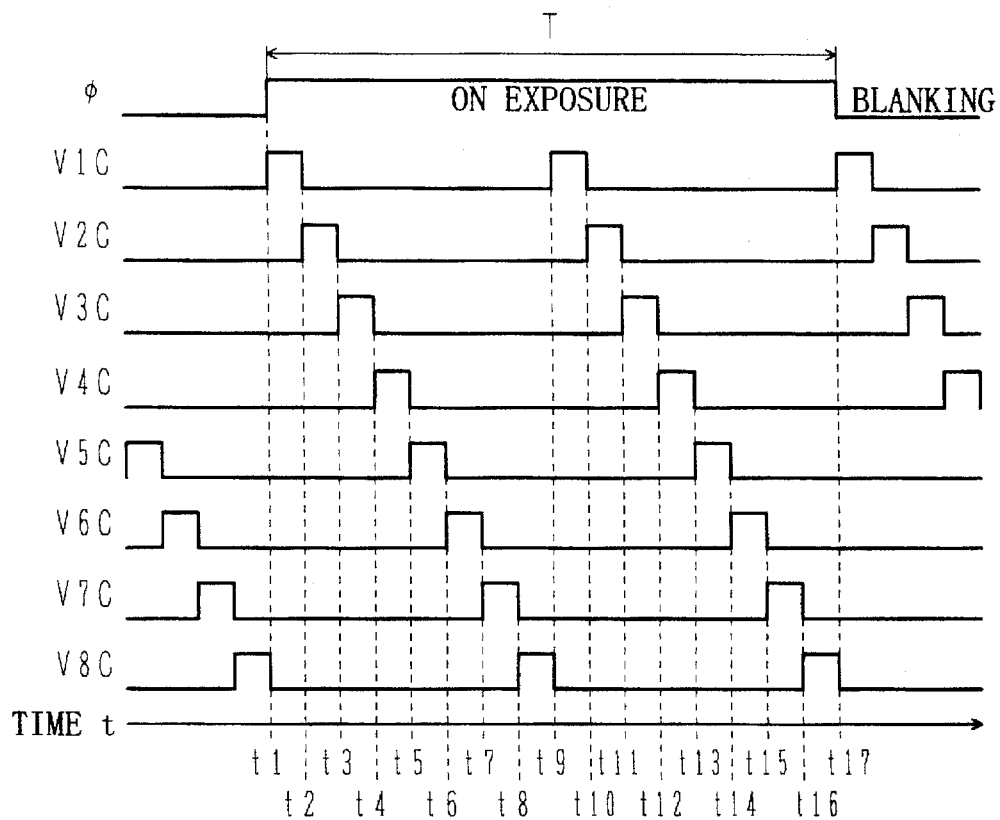
FIGS. 8(A) and 8(B) show a third variation of the first embodiment of the present invention with FIG. 8(A) showing waveform diagrams of the voltages applied to the deflectors and FIG. 8 (B) illustrating the beam scanning on a stencil mask by the deflectors.
Figure 8B:
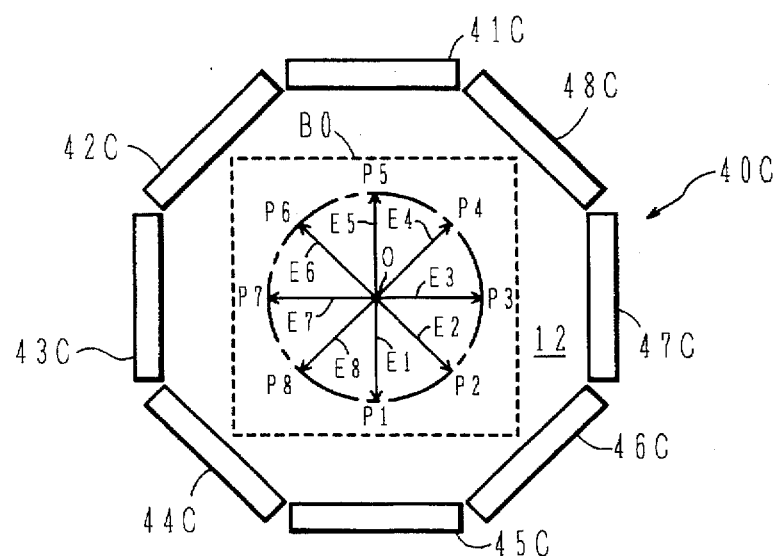

FIGS. 8(A) and 8(B) show a third variation of the first embodiment. The block B0 and the electrostatic deflector 40 in FIG. 8(B) are not presented at the same scale.

An electrostatic deflector 40C shown in FIG. 8(B) is provided with 8 deflecting electrodes 41C to 48C and is used in place of the electrostatic deflector 40 shown in FIG. 2. Likewise, 8-pole electrostatic deflectors are employed in place of the electrostatic deflectors 50 and 60 in FIG. 2, and since the relationship between these electrostatic deflectors and the electrostatic deflector 40C can be understood easily in reference to FIG. 2 and the explanation given above, its explanation is omitted here.

The cyclic wave generating circuit 70 in FIG. 2 outputs a pulse wave and drive voltages V1C to V8C shown in FIG. 8(A) are supplied to the deflecting electrodes 41C to 48C respectively. E1 to E8 in FIG. 8(B) respectively indicate electric field vectors at the center 0 of the electrostatic deflector 40C after the pulse has risen at the time points t1 to t8 respectively. The center of the electron beam is positioned at P5, P6, P7, P8, P1, P2, P3 and P4 respectively, after the pulse has risen at the time points t=t1 to t8. Since the period of time that corresponds to the period τ2 in FIG. 6(A) is 0, the central position of the electron beam scans on the circumference indicated with alternate long and short lines.

In this third variation, singe the 8-pole electrostatic deflector 40C is used, more precise scanning on the block B0 is possible even with a pulse wave employed for driving the electrostatic deflector 40C and, consequently, it is possible to achieve more constant in the average current density distribution on the block B0 compared to the first variation.

Fourth variation of the first embodiment

Figure 9:
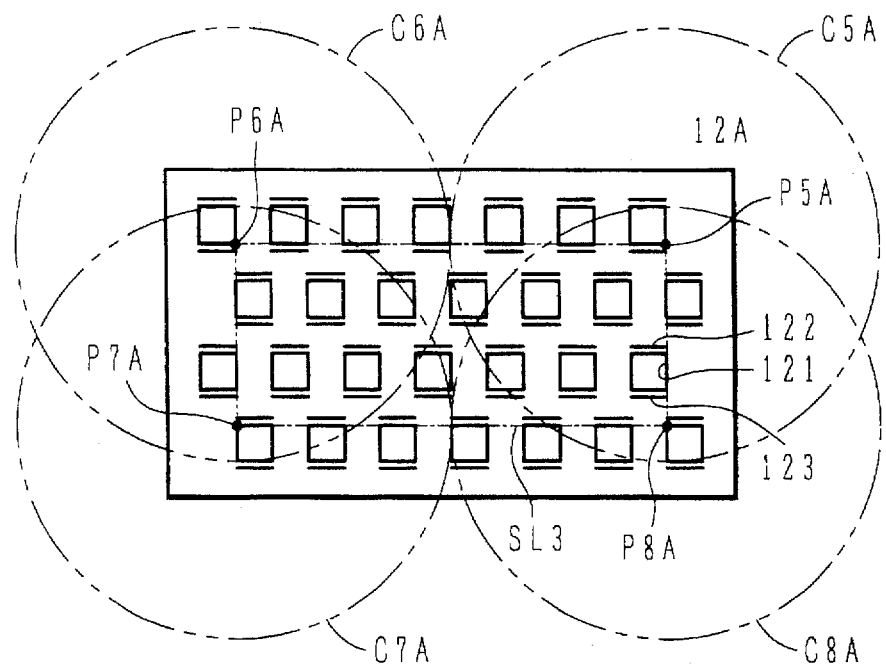
FIG. 9(A) is a plan view of the scanning of charged particle beam on a blanking aperture in a fourth variation of the first embodiment according to the present invention and FIG. 9(B) shows the scanning of a charged particle beam on a blanking aperture in a fifth variation of the first embodiment according to the present invention.
Figure 9:
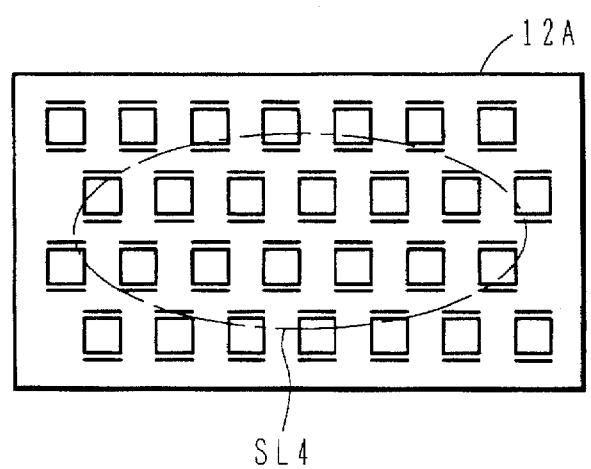

FIG. 9 shows scanning of the charged particle beam on a blanking aperture array mask 12A when the blanking aperture array mask 12A of the known art is used instead of the stencil mask 12 shown in FIG. 1.

Small apertures 121 are formed in a lattice pattern on the blanking aperture array mask 12A and a pair of blanking electrodes 122 and 123 are formed at the edges of each aperture 121. A beam that has passed through the apertures 121 then passes through the aperture of the aperture stop 31 when the voltage between the blanking electrodes 122 and 123 is set to 0, and when this voltage is set at a specific value, the beam is blocked at the aperture stop 31.

As a result, depending upon the patterns of the voltages applied to these electrodes, any minute pattern can be exposed on the semiconductor wafer 11. When the blanking aperture array mask 12A is employed, continuous exposure is performed in order to achieve higher speed and one exposure period T over which one of the voltage patterns described above is supplied corresponds to the one shot period of block exposure employing a stencil mask.

Scanning is performed at a constant speed on the rectangular beam-scanning line SL3 indicated with the alternate long and short lines. This scanning may be performed by using, for instance, a saw-tooth wave. In this fourth variation, too, since the average current density distribution of the charged particle beam on a block can be made approximately constant without having to reduce the size of the blanking aperture array mask 12A, it is possible to draw more minute patterns without reducing the throughput of exposure. In addition, by increasing the size of the blanking aperture array mask 12A, the throughput of exposure can be improved. Furthermore, by increasing the demagnification rate of projection and also increasing the size of the blanking aperture array mask 12A, the service life of the blanking aperture array mask 12A is extended.

Fifth variation of the first embodiment

FIG. 9(B) shows a variation of FIG. 9(A), and the beam scanning line SL4 in this case forms an oval shape. This oval shape can be achieved easily by setting the gain of the pair of amplifiers 72 and 74 in FIG. 2 larger than that of the pair of amplifiers 71 and Sixth variation of the first embodiment FIGS. 12(A) and 12(B) show a fifth variation of the first embodiment according to the present invention with FIG. 12(A) showing another structural example of the delay circuit shown in FIG. 2 and FIG. 12(B) showing waveform diagrams for the deflectors.

Figure 12A:
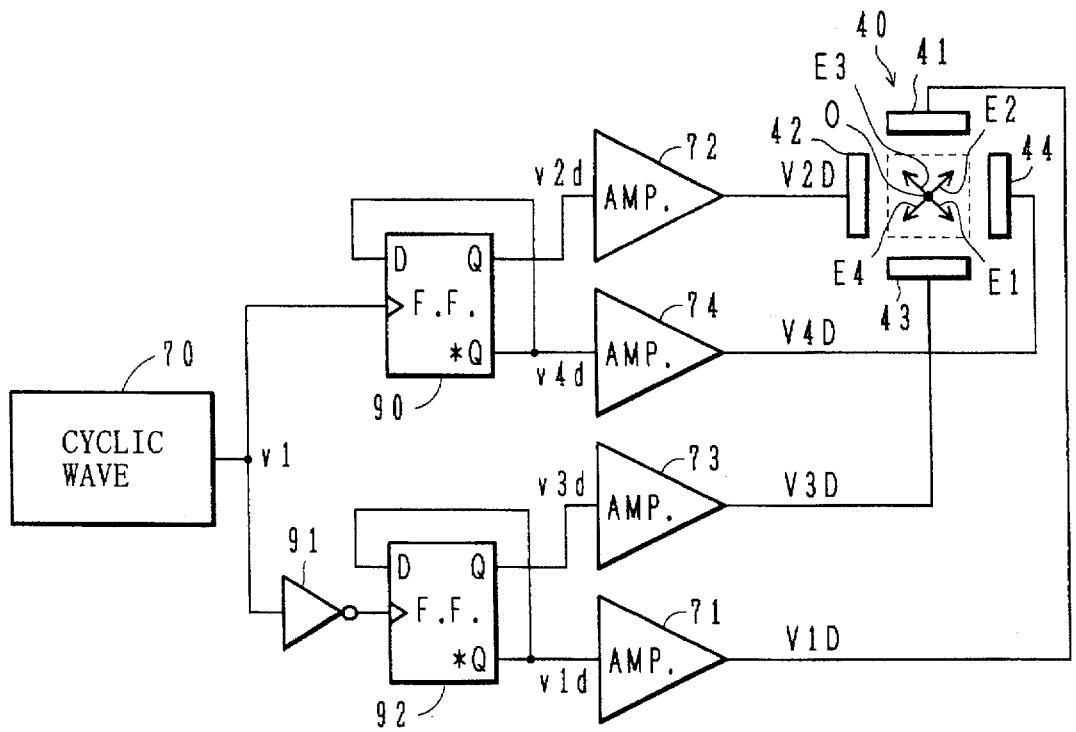
FIGS. 12(A) and 12(B) show a fifth variation of the first embodiment according to the present invention with FIG. 12(A) showing another structural example of the delay circuit shown in FIG. 2 and FIG. 12(B) showing waveform diagrams for the deflectors.
Figure 12B:
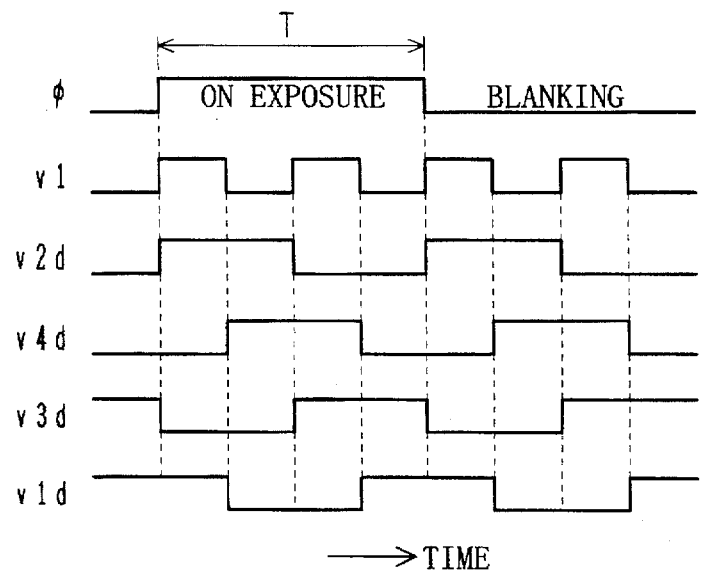

The cyclic wave generating circuit 70 outputs a square pulse wave v1 as shown in FIG. 12(B). The delay circuit is a logical one which comprises a D-flip-flop 90, an inverter 91 and a D-flip-flop 92. Each of the D-flip-flops 90 and 92 constructs T-flip-flop by connecting a data input D to an inverted output *Q. The output signal v1 is provided both to a clock input of the D-flip-flop 90 and through the inverter 91 to a clock input of the D-flip-flop 92. Signals v2d and v4d shown in FIG. 12(B) from an output Q and an inverted output *Q of the D-flip-flop 90 and signals v3d and v1d shown in FIG. 12(B) from an output Q and an inverted output *Q of the D-flip-flop 92 are provided to the amplifiers just as in the case of FIG. 2. For ease of illustration, deflectors 50, 60 and amplifiers 75 to 78 of FIG. 2 are omitted from FIG. 12(A).

E1 to E4 in FIG. 12(A) respectively indicate electric field vectors at the center 0 of the electrostatic deflector 40. When the signals v1d and v2d are 'high' state, the electric field vector E1 arises. When the signals v2d and v3d are 'high' state, the electric field vector E2 arises. When the signals v3d and v4d are 'high' state, the electric field vector E3 arises. When the signals v4d and v1d are 'high' state, the electric field vector E4 arises.

The relationship between the electrostatic deflector 40 and the electrostatic deflectors 50 and 60 is similar to that in the first embodiment explained earlier.

Second Embodiment

Figure 10:
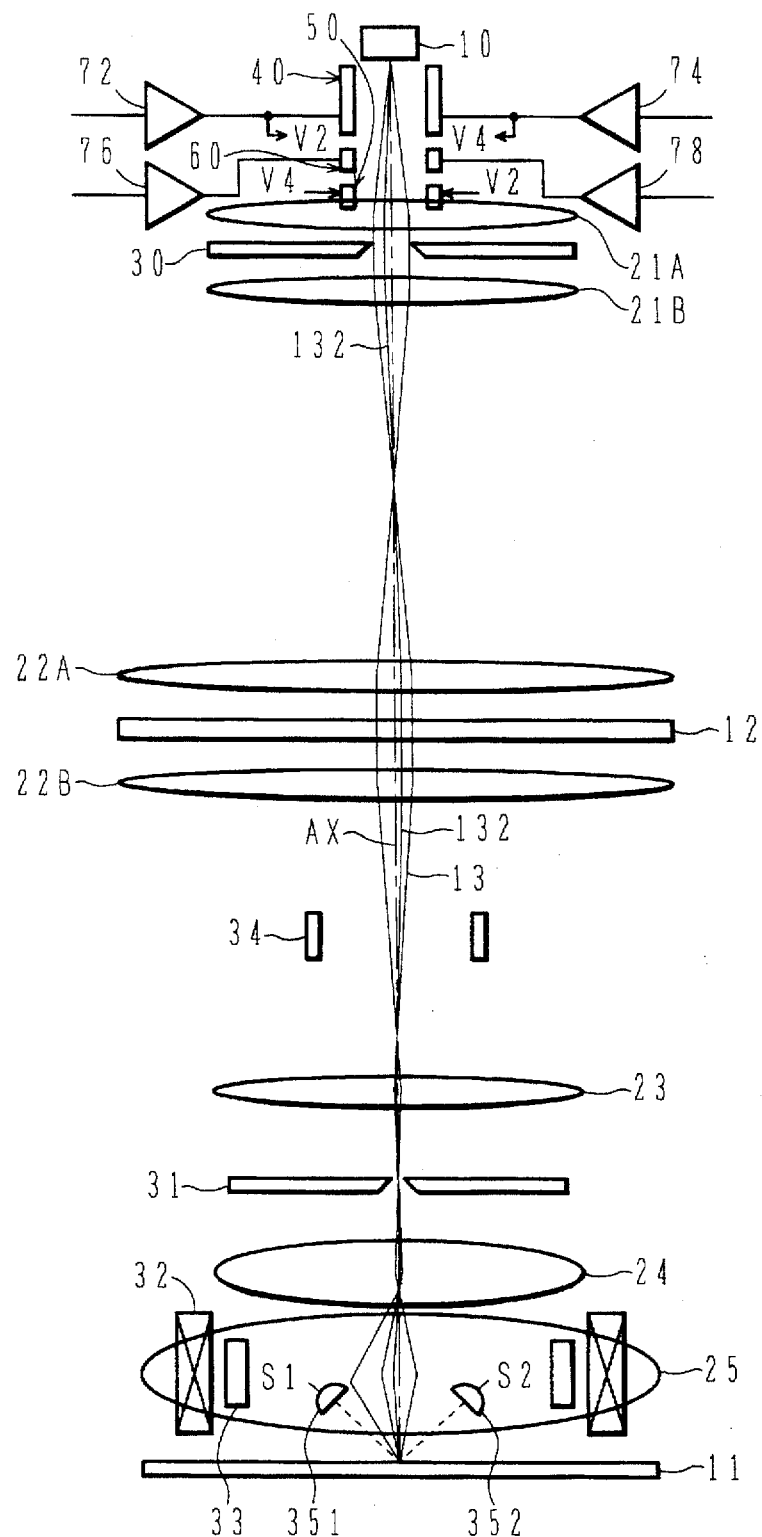
FIG. 10 is a schematic illustration of a system for charged particle beam exposure in a second embodiment according to the present invention.

FIG. 10 shows the main portion of a system for charged particle beam exposure in the second embodiment according to the present invention. In this system, the electrostatic deflectors 40, 50 and 60 are positioned between the charged particle gun 10 and the aperture stop 30. Scanning of the charged particle beam is performed at the aperture of the aperture stop 30 as likely the same as shown in FIG. 5(A), and average current density distribution at the aperture can be made approximately constant as likely the same as Im shown in FIG. 5(B). The locus 132 is, as the same as locus 131 in FIG. 1, a polygonal approximation of the locus obtained when a charged particle beam which has passed through the optical axis AX and has entered the electrostatic deflector 40 is deflected by the electrostatic deflectors 40 and 50.

With this embodiment, even if the range of scanning expands more than necessary, that portion of the charged particle beam is limited by the aperture stop 30, reducing unnecessary portion of the charged particle beam irradiated on the mask 12. It is possible to use a mask having one rectangular aperture to make variable shaped beam instead of the stencil mask 12. It is also possible to enlarge the aperture of the aperture stop 30 corresponding to the size of various masks, not possible in the prior art because of the Gaussian distribution of beam density.

Although preferred embodiments of the present invention has been described, it is to be understood that the invention is not limited thereto and that various changes and modifications may be made without departing from the spirit and scope of the invention.

For instance, the number of poles n in the electrostatic deflectors 40, 50 and 60 may be set at any even number that is equal to or larger than 4. In addition, the waveforms generated at the cyclic wave generating circuit 70 may be any cyclic waveform and it may be a Lissajous waveform or the like. Although it is desirable to connect the delay circuit 82 to 84 in series in order to achieve simplification of the structure, they may be connected in parallel.

The only positional requirement for the electrostatic deflector 40 is that it be positioned between the charged particle gun 10 and the mask 12 in principle. Since the quantities of deflection imparted by the electrostatic deflectors 40, 50 and 60 are small and the voltages provided and the deflection quantities are in a linear relationship, the only positional requirement for the electrostatic deflector 60 is that it be positioned between the charged particle gun 10 and the aperture stop 31 in principle, and the only positional requirement for the electrostatic deflector 50 is that it be positioned between the electrostatic deflector 40 and the aperture stop 31 in principle.

What is claimed is:

1. A system for charged particle beam exposure, comprising:

a charged particle gun for emitting said charged particle beam;

a mask having an aperture for shaping a cross section of said charged particle beam;

said system further comprising:

a first electrostatic deflector having n number of deflecting electrodes around an optical axis between said charged particle gun and said mask for deflecting said charged particle beam;

a second electrostatic deflector having n number of deflecting electrodes around said optical axis between said first electrostatic deflector and said mask for deflecting said charged particle beam;

a cyclic wave generating circuit for outputting a cyclic wave with a cycle of T/m, where T is one exposure period and m is a natural number;

a delay circuit for essentially delaying said cyclic wave by a time of iT/(mn) for each i=1 to (n−1); and an amplifier circuit for amplifying said cyclic wave from said cyclic wave generating circuit and (n−1) delayed cyclic waves from said delay circuit to get 1st to nth drive voltages, said 1st to nth drive voltages being supplied to said n number of deflecting electrodes of said first electrostatic deflector respectively and to said n number of deflecting electrodes of said second electrostatic deflector respectively in such a way that an electric field formed at said first electrostatic deflector and an electric field formed at said second electrostatic deflector have opposite phases from each other.

2. A system according to claim 1, wherein said delay circuit includes (n−1) delay elements connected in series, each of (n−1) delay elements have a delay time T/(mn), said cyclic wave from said cyclic wave generating circuit is supplied to a first stage of said (n−1) delay elements, and a signal having passed through each of said (n−1) delay elements is output.

3. A system according to claim 2, wherein said cyclic wave from said cyclic wave generating circuit is a sine wave, and said amplifier circuit is connected to said first and second electrostatic deflectors in such a way that a phase difference of waveforms supplied to adjacent deflecting electrodes is T/(mn).

4. A system according to claim 2, wherein said cyclic wave from said cyclic wave generating circuit is a pulse wave.

5. A system according to claim 4, wherein said cyclic wave generated circuit have means for setting a pulse width of said pulse wave.

6. A system according to claim 4, wherein said cyclic wave generated circuit have means for setting said m.

7. A system according to claim 1, further comprising:

a first aperture stop having a first aperture for allowing a portion of said charged particle beam to pass through;

a second aperture stop having a second aperture for allowing a portion of said charged particle beam having passed through said mask; and an electron lens system for making said charged particle beam cross over at said second aperture, and for getting demagnificated projection of a shaped charged particle beam on said object;

wherein said first electrostatic deflector is for deflecting said charged particle beam to make a time averaged current density of said charged particle beam approximate constant, either within an area where said charged particle beam is to be irradiated on said mask or at said first aperture; and said second electrostatic deflector is for deflecting said charged particle beam to ensure that said charged particle beam passes through said second aperture.

8. A system according to claim 7, further comprising a third electrostatic deflector, having n number of deflecting electrodes around said optical axis between said charged particle gun and said second aperture stop, for deflecting said charged particle beam to correct offset of said charged particle beam at said second aperture;

wherein said amplifier circuit amplifies said cyclic wave from said cyclic wave generating circuit and (n−1) delayed cyclic waves from said delay circuit to get another 1st to nth drive voltages, said another 1st to nth drive voltages being supplied to said n number of deflecting electrodes of said third electrostatic deflector respectively in such a way that said electric field formed at said first electrostatic deflector and an electric field formed at said third electrostatic deflector have phases identical to, or opposite from each other.

9. A method of exposing a pattern on an object using a system, said system comprising:

a charged particle gun for emitting said charged particle beam;

a mask having an aperture for shaping a cross section of said charged particle beam;

a first electrostatic deflector having n number of deflecting electrodes around an optical axis between said charged particle gun and said mask for deflecting said charged particle beam; and a second electrostatic deflector having n number of deflecting electrodes around said optical axis between said first electrostatic deflector and said mask for deflecting said charged particle beam;

said method comprising the step of:

generating a first cyclic wave with a cycle of T/m, where T is one exposure period and m is a natural number;

delaying said cyclic wave by a time of iT/(mn) for each i=1 to (n−1); and amplifying said cyclic wave and (n−1) delayed cyclic waves to get 1st to nth drive voltages; and supplying said 1st to nth drive voltages to said n number of deflecting electrodes of said first electrostatic deflector respectively and to said n number of deflecting electrodes of said second electrostatic deflector respectively in such a way that an electric field formed at said first electrostatic deflector and an electric field formed at said second electrostatic deflector have opposite phases from each other.

10. A method according to claim 9, wherein said cyclic wave is a sine wave, and a phase difference of waveforms supplied to adjacent deflecting electrodes of said first and second electrostatic deflectors is T/(mn).

11. A method according to claim 9, wherein said cyclic wave is a pulse wave, and said method further comprising the step of adjusting said approximate constant of said average current density distribution by adjusting a pulse width of said pulse wave.

* * * * *